(12) United States Patent
Chu et al.

(10) Patent No.: US 7,562,273 B2
(45) Date of Patent: Jul. 14, 2009

(54) REGISTER FILE CELL WITH SOFT ERROR DETECTION AND CIRCUITS AND METHODS USING THE CELL

(75) Inventors: Sam Gat-Shang Chu, Round Rock, TX (US); Daniel R. Knebel, Mahopac, NY (US); Stephen V. Kosonocky, Wilton, CT (US)

(73) Assignee: International Business Machines Corporation, Armonk, NY (US)

( * ) Notice: Subject to any disclaimer, the term of this patent is extended or adjusted under 35 U.S.C. 154(b) by 439 days.

(21) Appl. No.: 11/446,348

(22) Filed: Jun. 2, 2006

(65) Prior Publication Data

US 2007/0300131 A1  Dec. 27, 2007

(51) Int. Cl.
*G01R 31/28* (2006.01)
(52) U.S. Cl. ..................................... 714/726
(58) Field of Classification Search .......... 714/718, 714/726
See application file for complete search history.

(56) References Cited

U.S. PATENT DOCUMENTS

| | | |
|---|---|---|
| 4,954,988 A | 9/1990 | Robb |
| 5,481,495 A | 1/1996 | Henkels et al. |
| 6,378,108 B1 * | 4/2002 | Schoellkopf ................ 714/800 |
| 6,584,589 B1 * | 6/2003 | Perner et al. ................ 714/721 |
| 6,775,180 B2 * | 8/2004 | Biyani et al. ................ 365/154 |
| 2006/0215465 A1 * | 9/2006 | Bhavnagarwala et al. ............... 365/189.12 |

OTHER PUBLICATIONS

Weste et al., "Principles of CMOS VLSI Design: A systems Perspective", Second Edition, pp. 580-582, Addison & Wesley, Redding, 1993.

* cited by examiner

*Primary Examiner*—James C Kerveros
(74) *Attorney, Agent, or Firm*—Ryan, Mason & Lewis, LLP

(57) ABSTRACT

Techniques are provided for a register file cell that includes a primary storage portion configured to store a first value, and a secondary storage portion that is coupled to the primary storage portion. The secondary storage portion is configured to function as a scan latch during a test operation, and is further configured to store a second value during normal operation. The second value is a duplicate of the first value. The cell further includes an error detection portion that is coupled to the primary storage portion and the secondary storage portion and is configured to indicate a difference between the first value and the second value, caused by a soft error.

18 Claims, 7 Drawing Sheets

ADDED NEW CIRCUIT FOR SOFT ERROR DETECTION

METHOD:

NORMAL OPERATION:
BCLK = OR (wwl0, wwl1, wwl2, wwl3)

GLOBAL DYNAMIC OR ACROSS WORD TO CHECK
FOR SER FAILS DURING READ OPERATION

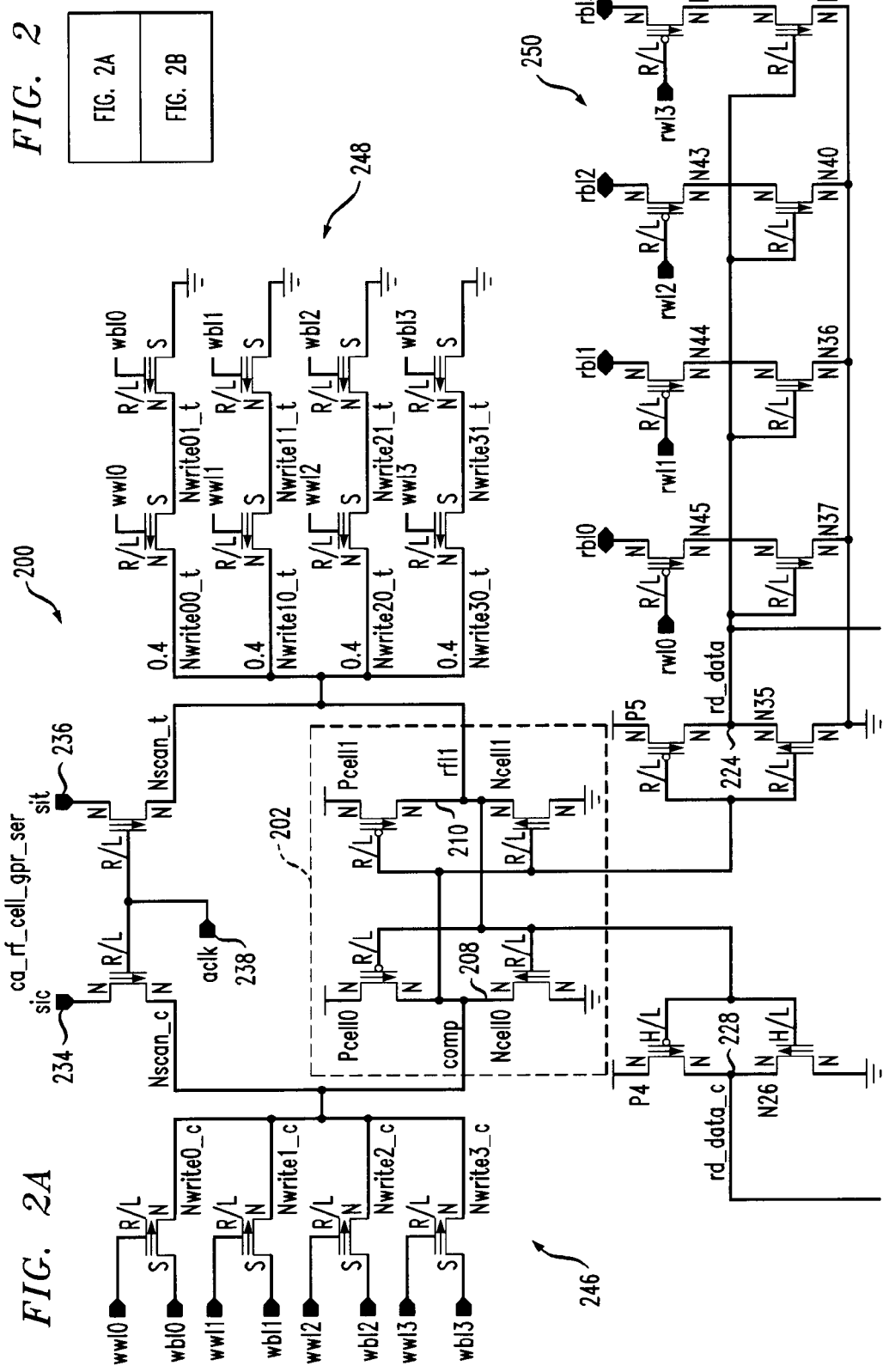

ERROR DETECT DYNAMIC OR

REGISTER FILE CELL WITH SOFT ERROR DETECTION AND CIRCUITS AND METHODS USING THE CELL

FIELD OF THE INVENTION

The present invention generally relates to electronic circuitry and, more particularly, to register file cells and circuits and methods using the cells.

BACKGROUND OF THE INVENTION

As the dimensions of complimentary metal oxide semiconductor (CMOS) technology scale down, the capacitance in memory cells also scales, causing an increased sensitivity to upset by charged particles. Upsets from such particles are known as soft errors. Conventionally, to deal with this problem, parity bits are generated and stored as additional cells. This requires the generation and checking of the parity bits and in addition, consumes area and power.

FIG. 1 depicts a conventional register file 100 employing level sensitive scan design (LSSD) testing. Conventional file 100 includes a-clock and b-clock input ports 102, 104. Also included are scan-in true and complimentary ports 106, 108, and scan-out true and complimentary ports 110, 112.

The register file 100 includes a plurality of register file cells 114. In the example depicted in FIG. 1, these are arranged as n+1 rows numbered 0-n, and m+1 columns, numbered 0-m. Thus, the particular register file 100 contains n+1 entries having m+1 bits per word. Each cell has a-clock, b-clock, scan-in true, scan-in complimentary, scan-out true, and scan-out complimentary ports 116 through 126.

The particular example shown in FIG. 1 includes four write word lines numbered WWL0-WWL3, four read word lines numbered RWL0-RWL3, four write bit lines numbered WBL0-WBL3, and four read bit lines numbered RBL0-RBL3. Each register file cell 114 also includes appropriate ports for interconnection with the write and read word lines and write and read bit lines. Write decoders 128 and read decoders 130 are provided in a conventional manner.

Persons of skill in the art are familiar with the operation of conventional register files as shown in FIG. 1. For example, such register files are discussed in the book *Principles of CMOS VLSI Design: A Systems Perspective*, Second Edition, Neil H. E. Weste and Kameron Eshraghian, Addison & Wesley, Redding, 1993, at pages 580-582. Details of LSSD are also shown in the Weste and Eshraghian reference, at pages 489-493. During LSSD scan testing, the register file cells can be made scan-able and chained together, as described in U.S. Pat. No. 5,481,495 of Henkels et al., entitled "Cells And Read-Circuits For High-Performance Register Files." The b-clock and a-clock are alternatively pulsed and the data is serially loaded into each register file cell through the scan-in port.

A bit line OR circuit 132 is also included, as in known in the art.

In U.S. Pat. No. 4,954,988 of Robb, entitled "Memory Device Wherein a Shadow Register Corresponds to Each Memory Cell," a data storage device includes two registers associated with each cell of the memory. The first register forms a read/write memory register, and the second register forms a write-only shadow register connected to the memory register. During normal operations, each memory register operates as an independent random access memory (RAM) cell and each shadow register operates as an independent write-only RAM cell. When data is written to a shadow register, a flag bit is set. Subsequently, a validity check may be performed to verify the data. If the data does not verify, a clear line may be used to clear the flag bits. If the data verifies, the data in each shadow register with a flag bit set can be loaded into its corresponding memory register in a gang loading operation. If a shadow register flag bit is not set, the data in its corresponding memory register is not changed during gang loading. This technique does not address the need to verify the data at the time of the READ operation. In the techniques of the Robb reference, data in the shadow register could become corrupted by a soft error after being verified or after being written into the main storage latch.

It would be desirable to overcome the limitations in prior art approaches exemplified in FIG. 1.

SUMMARY OF THE INVENTION

Principles of the present invention provide techniques for register file cells. In one exemplary embodiment, a register file cell in accordance with one aspect of the invention includes a primary storage portion configured to store a first value, and a secondary storage portion that is coupled to the primary storage portion. The secondary storage portion is configured to function as a scan latch during a test operation, and is further configured to store a second value during normal operation. The second value is a duplicate of the first value. The cell further includes an error detection portion that is coupled to the primary storage portion and the secondary storage portion and is configured to indicate a difference between the first value and the second value, caused by a soft error.

In another aspect, an exemplary register file circuit includes a plurality of word line structures and a plurality of bit line structures that intersect the plurality of word line structures at a plurality of sites. The circuit further includes a plurality of register file cells of the kind just described, located at the plurality of sites and associated with corresponding ones of the word line structures and corresponding ones of the bit line structures.

In yet another aspect, an exemplary method of operating a register file circuit of the kind described includes storing first values in a plurality of primary storage portions of the cells, storing second values in a plurality of secondary storage portions of the cells, with the second values being duplicates of corresponding ones of the first values, and then detecting one or more soft errors that correspond to a difference between at least one of the first values and a corresponding one of the second values.

One or more embodiments of the present invention may be realized in the form of an integrated circuit.

These and other objects, features and advantages of the present invention will become apparent from the following detailed description of illustrative embodiments thereof, which is to be read in connection with the accompanying drawings.

BRIEF DESCRIPTION OF THE DRAWINGS

FIGS. 2A and 2B show an exemplary embodiment of a register file cell with soft error detection, according to an aspect of the invention;

DETAILED DESCRIPTION OF PREFERRED EMBODIMENTS

Figure 2B:
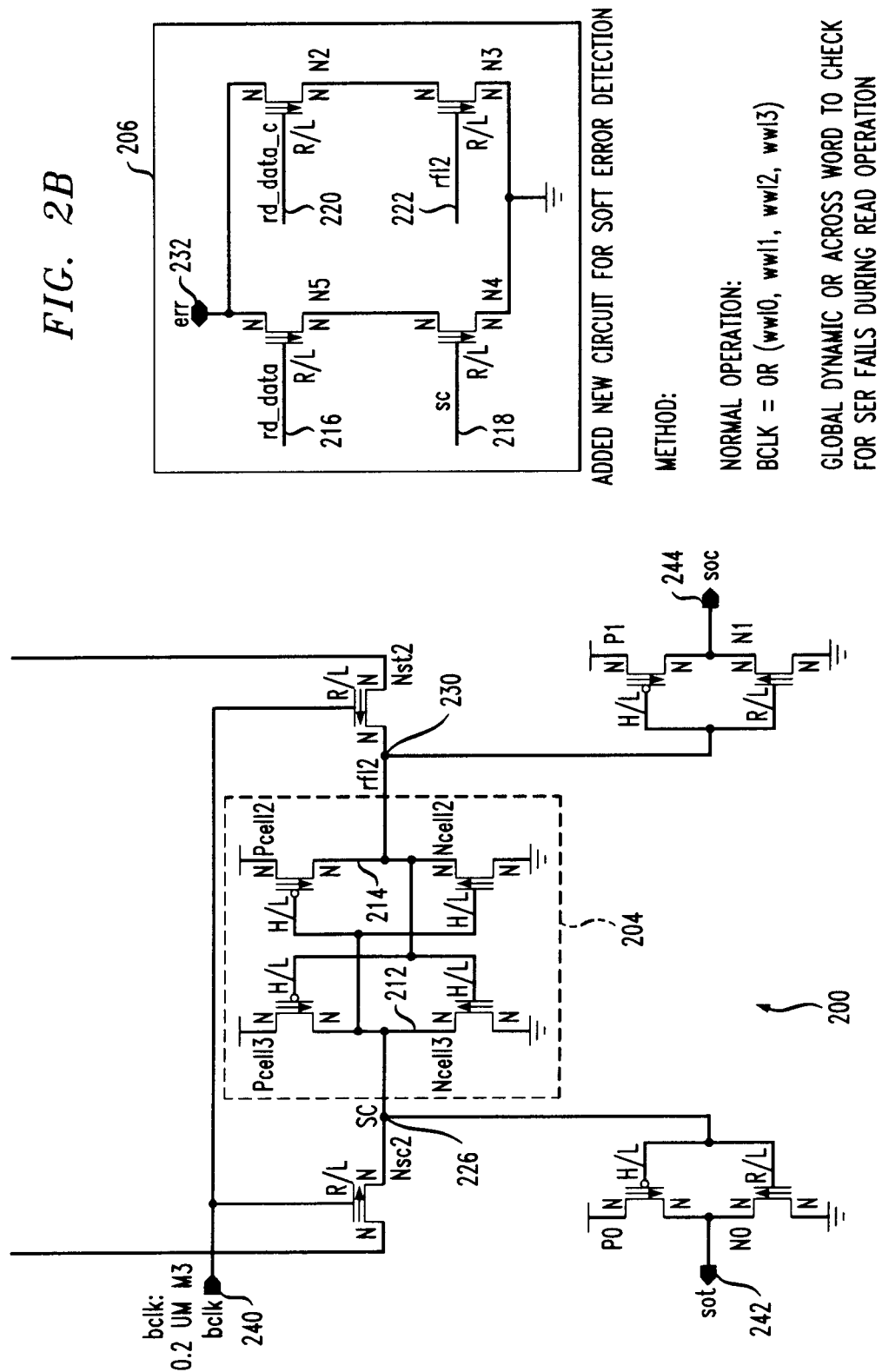

FIG. 2, comprising FIGS. 2A and 2B, depicts an exemplary embodiment of a register file cell 200 according to an aspect of the invention. File cell 200 generally includes a primary storage portion 202 that is configured to store a first value. Also included is a secondary storage portion 204 that is coupled to the primary storage portion 202 and is configured to function as a scan latch during test operation. Furthermore, secondary storage portion 204 is configured to store a second value during normal operation. The second value is a duplicate of the first value stored in the primary storage portion 202. Also included is an error detection portion 206 that is coupled to the primary storage portion 202 and the secondary storage portion 204 and that is configured to indicate a difference between the first value stored in primary storage portion 202 and the second value stored in secondary storage portion 204, caused by, e.g., a soft error.

The primary storage portion 202 can be realized, for example, as a pair of cross-coupled inverters 208, 210. Similarly, the secondary storage portion can be implemented as a secondary pair of cross-coupled inverters 212, 214. The error detection portion 206 can be implemented, for example, as an XOR gate. As shown at terminals 216, 218, 220, 222 respectively, the inputs to the error detection portion can include the read data signal at port 216, the scan complimentary signal at port 218, the read data complimentary signal at port 220, and the rfl2 signal at terminal 222. These signals are available at locations 224, 226, 228, 230 respectively in the main diagram. Appropriate interconnections can be provided between such locations and the corresponding terminals of the error detection portion. It will be appreciated that a high logic level will appear at the ERR port 232 of error detection portion 206 when the bits stored in the primary storage portion 202 and the secondary storage portion 204 do not match. This may occur when a charged particle impacts the register file. Because of the relatively small parasitic capacitances now found in scaled-down CMOS circuitry, the individual storage portions 202, 204 may be more vulnerable to soft errors caused by such charged particles than formerly.

Also included in cell 200 are scan-in complimentary and scan-in true ports 234, 236; a-clock and b-clock ports 238, 240; and scan-out true and complimentary ports 242, 244. The exemplary cell shown in FIGS. 2A and 2B is configured for use with four write words lines WWL0-WWL3, four write bit lines WBL0-WBL3, four read word lines RWL0-RWL3, and four read bit lines RBL0-RBL3. The true write bit lines and write word lines are located in the upper left-hand portion of FIG. 2A at region 246, while the complimentary counterparts are located in the upper right-hand portion 248. The read word line and read bit line interconnections are depicted at region 250 in FIG. 2A. It will be appreciated that the cell 200 can be subjected to LSSD testing, wherein the secondary storage portion 204 functions as a scan latch. Other appropriate types of testing could also be used. Note, in the exemplary embodiment as shown in FIG. 2B, transistors Nsc2 and Nst2 are preferably NFETS.

Figure 1:
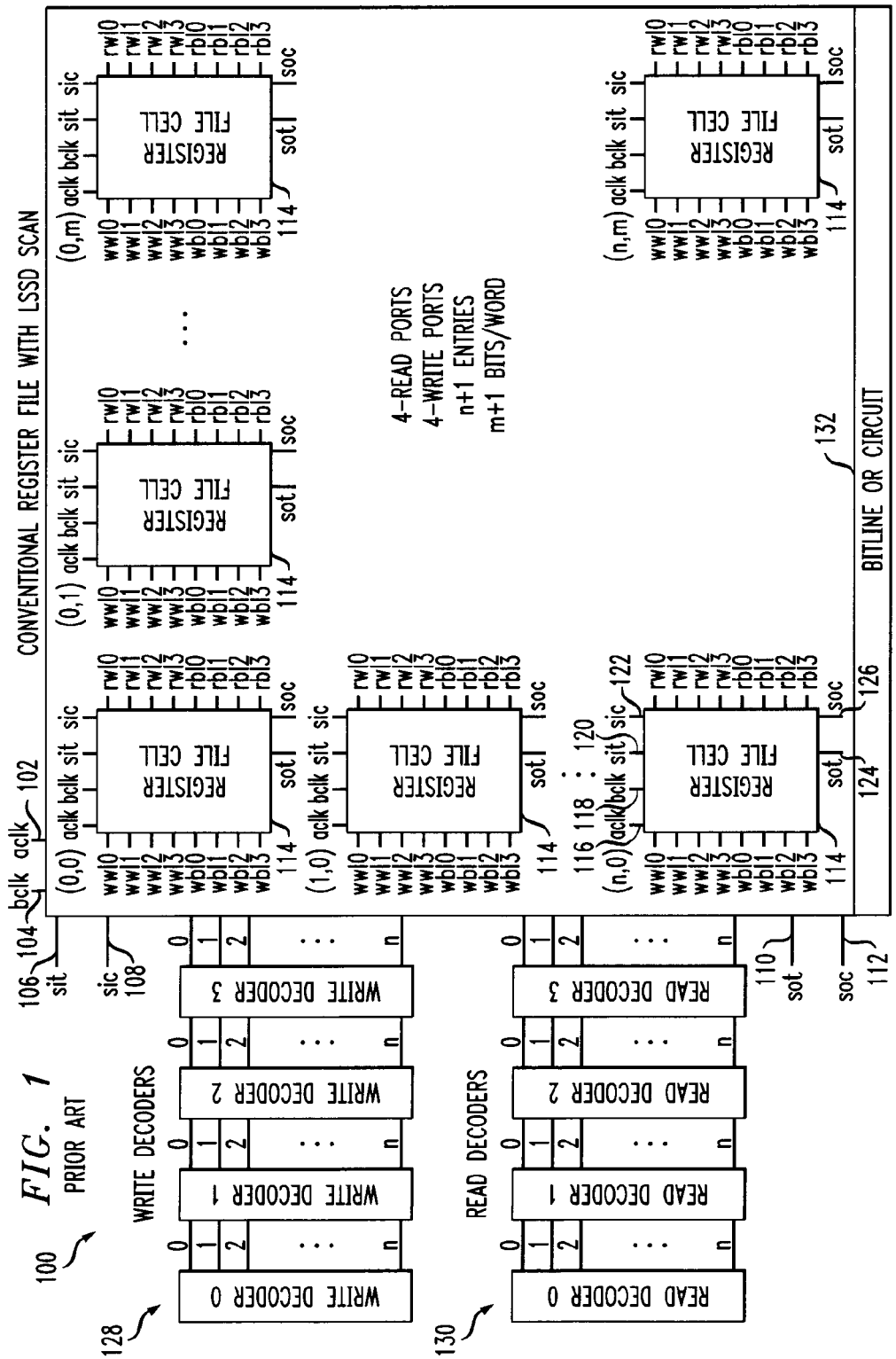
FIG. 1 shows a conventional register file.
Figure 3:
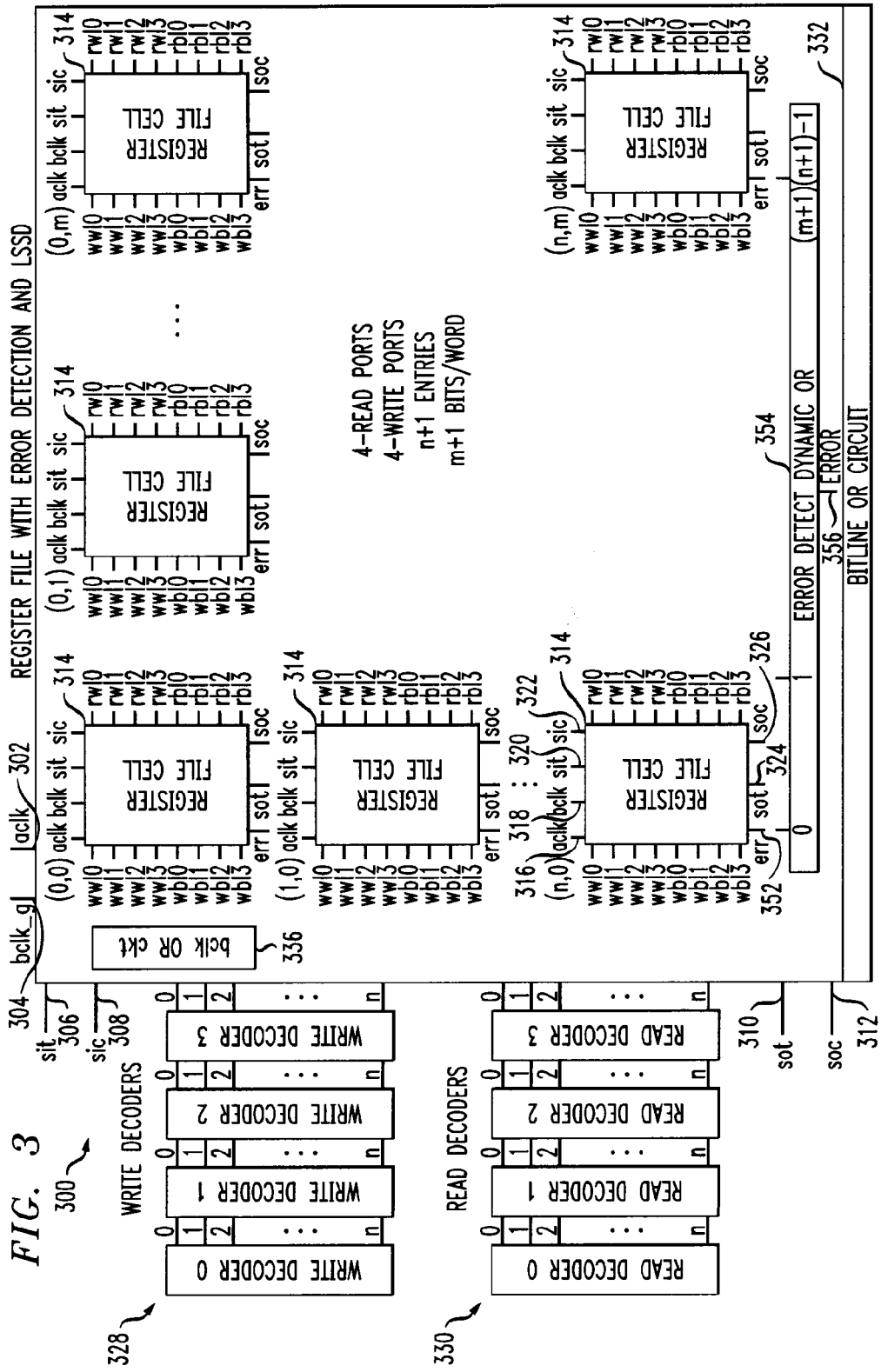
FIG. 3 shows an exemplary embodiment of a register file with error detection, according to another aspect of the invention.

Attention should now be given to FIG. 3, which depicts an exemplary embodiment 300 of a register file circuit according to an aspect of the invention. Elements in register file 300 similar to those in register file 100 of FIG. 1 have received the same reference character incremented by 200, and will not be separately described except to the extent that they differ in principle from the corresponding components of FIG. 1. Circuit 300 can include a plurality of word line structures, and a plurality of bit line structures that intersect the plurality of word line structures at a plurality of sites. As used herein, a word line structure includes one or more associated word lines, while a bit line structure includes one or more associated bit lines. By way of example and not limitation, a word line structure could include paired read and write word lines, while a bit line structure could include paired read and write bit lines. The exemplary embodiment 300 depicted in FIG. 3 includes four read ports and four write ports, and thus four write word lines WWL0-3, four read word lines RWL0-3, four write bit lines WBL0-3, and four read bit lines RBL0-3. As in FIG. 1, there are n+1 entries in n+1 rows and m+1 bits per word in m+1 columns.

Circuit 300 can include a plurality of register file cells 314 located at the plurality of sites. Each register file cell can be associated with a corresponding one of the word line structures and a corresponding one of the bit line structures. Each register file cell can be, for example, of the kind described with regard to FIG. 2. The circuit of FIG. 3 can be formed, if desired, as an integrated circuit. The ports of each cell can include four write word lines, WWL0-3, four write bit lines WBL0-3, four read word lines RWLO-3, and four read bit lines RBL0-3. Furthermore, each cell can include a-clock, b-clock, scan-in true and scan-in complimentary ports 316, 318, 320 and 322, as well as scan-out true and scan-out complimentary ports 324, 326. Each cell can also include an error port 352 corresponding, for example, to the error port 232 in FIG. 2B. The global b-clock 304 can be input to an appropriate b-clock OR circuit, together with other inputs to be described below, to generate local b-clock signals for each row. This will be discussed further with regard to FIG. 4 below. The b-clock OR circuit in FIG. 3 is designated as 336.

The error detection portions of each cell 314 can be configured to output an error signal at the error port 352 upon occurrence of a soft error. These error ports can be coupled to an error detect dynamic OR circuit 354. The error detect dynamic OR circuit 354 can have (n+1)(m+1) inputs numbered 0 through ((n+1)(m+1)−1) and configured to obtain the error signals from the error detection portions, and to output a global error signal 356 upon obtaining an error signal from at least one of the register file cells 314. Further details regarding the error detect dynamic OR circuit 354 are provided in FIG. 5.

Figure 4:
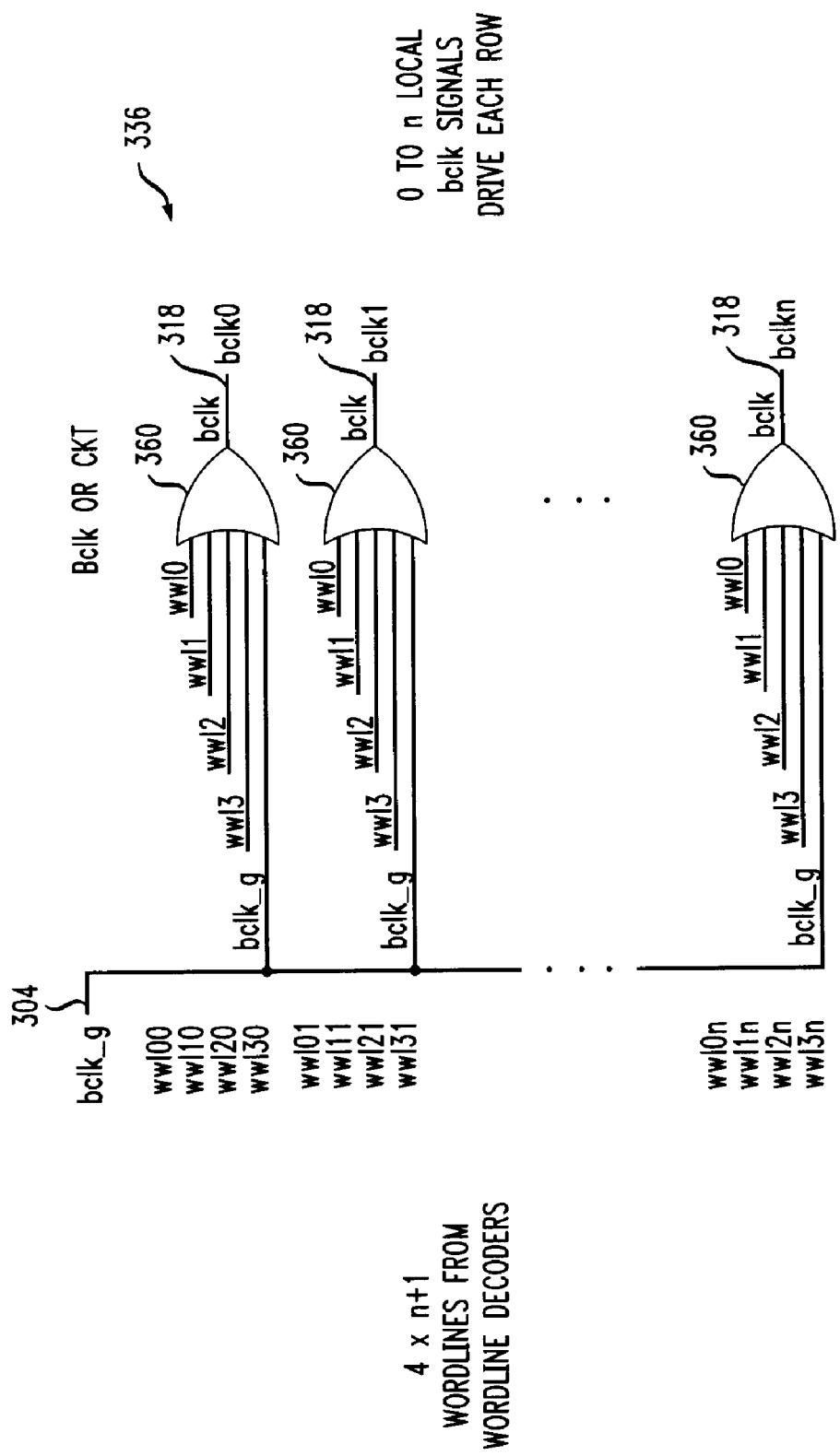
FIG. 4 shows an exemplary embodiment of a b-clock OR circuit of the circuit of FIG. 3.

As seen in FIG. 4, the b-clock OR circuit 336 can include n+1 b-clock generation circuits numbered 0-n, one for each of the n+1 rows of cells. The individual circuits can be configured to generate a local b-clock signal 318, associated with a given one of the rows 0-n, from the global b-clock signal 304. In the exemplary embodiment depicted in FIG. 4, OR gates 360 are employed. These have as inputs the write word lines 0-3 and the global b-clock signal.

It should be noted that the exemplary embodiments depicted herein have included four read ports, four write ports, four word line structures, and four bit lines structures. This is simply for purposes of illustration; the principles described herein can be extended to any number of word line structures, any number of bit line structures, any number of cells, and any configuration of cells. Further, the specific logic elements shown herein are also illustrative, and equivalent structures obtaining similar results can also be employed.

Figure 5:
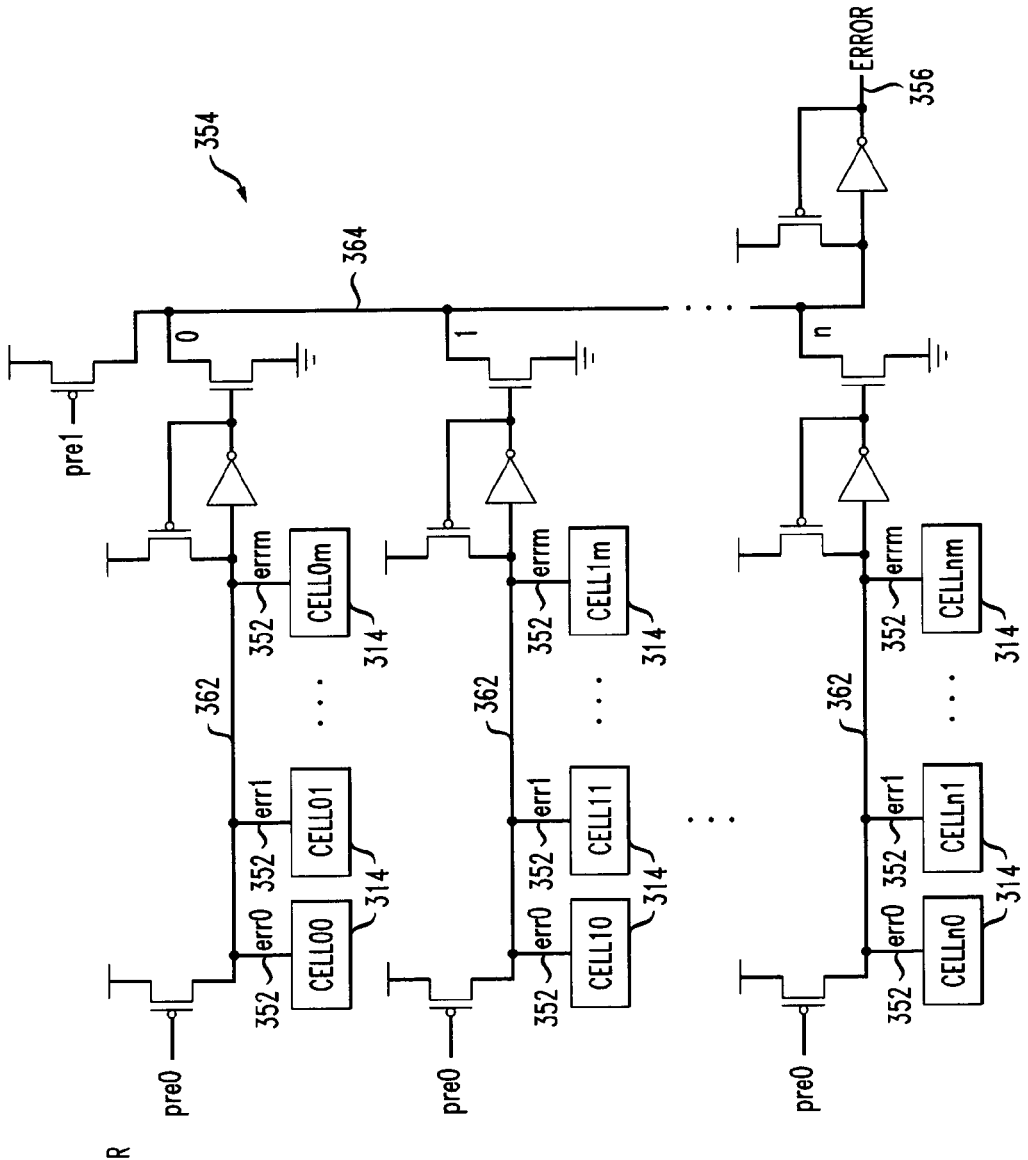
FIG. 5 shows an exemplary embodiment of an error detect dynamic OR circuit of the circuit of FIG. 3.

Attention should now be given to FIG. 5, for specific details regarding the error detect dynamic OR circuit 354. As depicted therein, each cell 314 in a given row has its error port 352 connected to a row error detect circuit 362. Each of the row error detect circuits 362 is configured to output a row error signal when one or more of the error ports 352 in a given row indicate an error. Row error detect circuits 362 can be connected to an interconnection portion 364. Portion 364 can be configured to output global error signal 356 when at least one of the row error detect circuits 362 indicates at least one error in at least one of the rows. As shown in FIG. 5, the row error detect circuits 362 are configured to OR together the outputs of the error detection portions received at ports 352, and the interconnection portion 364 is configured to OR together the outputs of the row error detect circuit 362. It will be appreciated that alternative configurations are possible. For example, the columns (instead of the rows) could be interconnected in individual circuits, and then the individual columns could be connected to an interconnection portion. It will be appreciated that the pre-charge signals, pre0 and pre1 respectively, turn on the associated transistors before a read operation is conducted.

Figure 6:
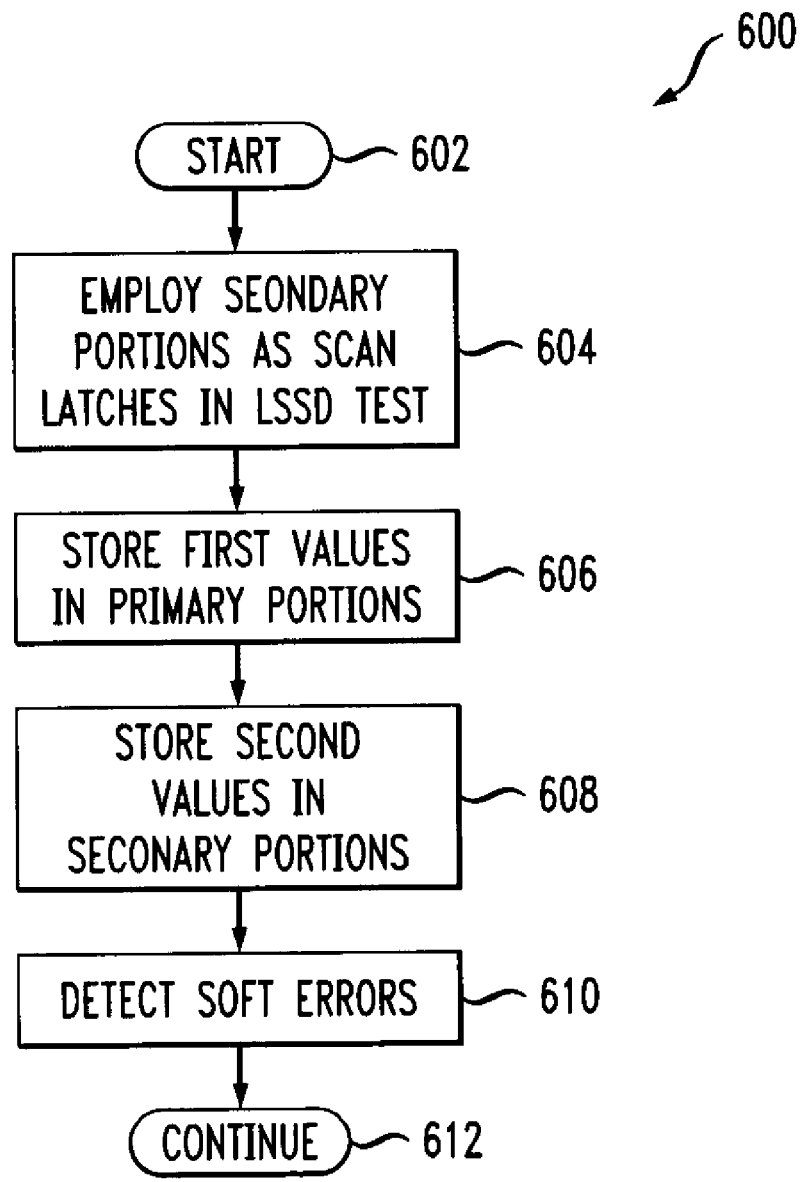
FIG. 6 shows a flow chart of an exemplary method of operating a register file circuit according to yet another aspect of the invention.

Attention should now be given to FIG. 6, which shows a flow chart 600 of an exemplary method of operating a register file circuit, including cells of the kind described herein, according to yet another aspect of the invention. After beginning at block 602, the method can include the steps of storing first values in a plurality of primary storage portions of the cells, as at block 606, storing second values in a plurality of secondary storage portions of the cells, as at block 608, and detecting at least one soft error corresponding to a difference between at least one of said first values and a corresponding one of said second values, as at block 610. The second values can be duplicates of corresponding ones of said first values.

The storing and detecting steps can be carried out during normal operation of the circuit. Optionally, the secondary storage portions can be employed as scan latches during test operation of the circuit, as at block 604. The test operation can include level sensitive scan design (LSSD) testing, or other suitable testing. Processing continues as needed at block 612.

It should be noted that as used herein, including the claims, when a second value is referred to as being a duplicate of a first value, this is to be understood in a logical sense. In the example shown herein, the same value (i.e., 0 for 0 and 1 for 1) is stored as the duplicate, and a disagreement between the two is found with an exclusive OR gate, indicating a soft error. However, one could instead store the duplicate as a complement, i.e., 1 as the duplicate of 0 and 0 as the duplicate of 1, and then detect a difference caused by a soft error when the two values unexpectedly agreed. In such a case, one could employ an exclusive NOR gate for error detection. One could also use a logical low value for an error signal in any of the schemes described; in this case, for the complementary duplicate scheme, one could use an exclusive OR gate for error detection.

Circuits including register file cells as described above can be part of the design for an integrated circuit chip. The chip design can be created, for example, in a graphical computer programming language, and stored in a computer storage medium (such as a disk, tape, physical hard drive, optical disc storage (e.g. CDROM, DVD), or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, memory, and a central processor.

The register file cells, circuits and techniques of the present invention can be used in a variety of processors with a single or multiple cores. A processor can be a general purpose microprocessor, a general purpose central processor, a network processor, a graphic processor, a low power processor used in hand-held computing devices and mobile devices such as cell-phones, etc.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A register file cell comprising:
   a primary storage portion configured to store a first value, said primary portion having associated therewith a read data true terminal and a read data complementary terminal;
   a secondary storage portion coupled to said primary storage portion and configured to function as a scan latch during test operation, said secondary storage portion being configured to store a second value during normal operation, said second value being a duplicate of said first value, said secondary storage portion having associated therewith a scan complementary terminal and an rf12 terminal; and
   an error detection portion coupled to said primary storage portion and said secondary storage portion and configured to indicate a difference between said first value and said second value caused by a soft error;
   wherein:
   said error detection portion comprises an XOR gate, said XOR gate having four inputs coupled, respectively, to said read data true terminal, said read data complementary terminal, said scan complementary terminal and said rf12 terminal.

2. The cell of claim 1, wherein said primary storage portion comprises a primary cross-coupled inverter pair and said secondary storage portion comprises a secondary cross-coupled inverter pair.

3. The cell of claim 1, wherein said test operation comprises level sensitive scan design (LSSD) testing.

4. The cell of claim 1, wherein said error detection portion is configured to detect soft errors caused by charged particles.

5. A register file circuit comprising:
a plurality of word line structures;
a plurality of bit line structures intersecting said plurality of word line structures at a plurality of sites; and
a plurality of register file cells located at said plurality of sites, each of said register file cells being associated with a corresponding one of said word line structures and a corresponding one of said bit line structures, each of said register file cells in turn comprising:
- a primary storage portion configured to store a first value, said primary portion having associated therewith a read data true terminal and a read data complementary terminal;
- a secondary storage portion coupled to said primary storage portion and configured to function as a scan latch during test operation, said secondary storage portion being configured to store a second value during normal operation, said second value being a duplicate of said first value, said secondary storage portion having associated therewith a scan complementary terminal and an rfl2 terminal; and
- an error detection portion coupled to said primary storage portion and said secondary storage portion and configured to indicate a difference between said first value and said second value caused by a soft error, said error detection portion having an output;
wherein:
said error detection portion comprises an XOR gate, said XOR gate having four inputs coupled, respectively, to said read data true terminal, said read data complementary terminal, said scan complementary terminal and said rfl2 terminal.

6. The register file circuit of claim 5, wherein said primary storage portion comprises a primary cross-coupled inverter pair and said secondary storage portion comprises a secondary cross-coupled inverter pair.

7. The register file circuit of claim 5, wherein said test operation comprises level sensitive scan design (LSSD) testing.

8. The register file circuit of claim 5, wherein said error detection portion is configured to detect soft errors caused by charged particles.

9. The register file circuit of claim 5, wherein said circuit comprises an integrated circuit.

10. The register file circuit of claim 5, wherein said cells are arranged in n+1 rows, further comprising n+1 b-clock generation circuits, one of said b-clock generation circuits being associated with each of said rows.

11. The register file circuit of claim 10, wherein said b-clock generation circuits are configured to generate, from a global b-clock signal, a local b-clock signal associated with a given one of said rows.

12. The register file circuit of claim 11, wherein:
said word line structures comprise a plurality of write word lines; and
said b-clock generation circuits comprise OR gates configured to OR a plurality of inputs to obtain said local b-clock signal for said given one of said rows, said plurality of inputs comprising:
- a signal from said global b-clock circuit; and
- a plurality of write word line inputs from said plurality of write word lines.

13. The register file circuit of claim 5, wherein:
said cells are arranged in n+1 rows and m+1 columns; and
each of said error detection portions is configured to output an error signal upon occurrence of a soft error;
further comprising a dynamic error detect circuit having n+1 x m+1 inputs configured to obtain said error signals from said error detection portions, and to output a global error signal upon obtaining at least one of said error signals.

14. The register file circuit of claim 13, wherein said dynamic error detect circuit comprises:
a plurality of row error detect circuits having outputs and configured to output a row error signal upon at least one error detection portion in a given one of said rows outputting one of said error signals; and
an interconnection portion coupled to said outputs of said row error detect circuits and configured to output said global error signal upon at least one of said row error detect circuits outputting one of said row error signals.

15. The register file circuit of claim 14, wherein:
said plurality of row error detect circuits are configured to OR together said outputs of said error detection portions; and
said interconnection portion is configured to OR together said outputs of said row error detect circuits.

16. A method of operating a register file circuit having a plurality of cells, each of said cells in turn having a primary storage portion and a secondary storage portion, said method comprising the steps of:
employing said secondary storage portions as scan latches during test operation of said circuit;
during normal operation of said circuit, storing first values in said primary storage portions of said cells;
during said normal operation of said circuit, storing second values in said secondary storage portions of said cells, said second values being duplicates of corresponding ones of said first values; and
detecting at least one soft error corresponding to a difference between at least one of said first values and a corresponding one of said second values.

17. The method of claim 16, wherein:
said primary storage portions each have associated therewith a read data true terminal and a read data complementary terminal;
said secondary storage portions each have associated therewith a scan complementary terminal and an rfl2 terminal; and
said error detecting step comprises using an XOR gate, said XOR gate having four inputs coupled, respectively, to said read data true terminal, said read data complementary terminal, said scan complementary terminal and said rfl2 terminal, to detect said at least one soft error.

18. The method of claim 17, wherein said test operation comprises level sensitive scan design (LSSD) testing.

* * * * *